(12) United States Patent
Choi et al.

(10) Patent No.: US 9,956,616 B2
(45) Date of Patent: May 1, 2018

(54) NANO-WIRE AND METHOD FOR MANUFACTURING THE SAME

(75) Inventors: Joon Rak Choi, Seoul (KR); Jong Woon Moon, Seoul (KR); Young Sun You, Seoul (KR); Yong Sang Cho, Seoul (KR); Kyoung Hoon Chai, Seoul (KR); Hyeok Soo Suh, Seoul (KR); Sang Hoon Lee, Seoul (KR); Yong Sang Lee, Seoul (KR); Won Jong Choi, Seoul (KR)

(73) Assignees: LG INNOTEK CO., LTD., Seoul (KR); NANOPYXIS CO., LTD., Jeonju, Jeollabuk-do (KR)

( * ) Notice: Subject to any disclaimer, the term of this patent is extended or adjusted under 35 U.S.C. 154(b) by 1037 days.

(21) Appl. No.: 14/236,045

(22) PCT Filed: Jul. 25, 2012

(86) PCT No.: PCT/KR2012/005944
§ 371 (c)(1),
(2), (4) Date: Aug. 26, 2014

(87) PCT Pub. No.: WO2013/019020
PCT Pub. Date: Feb. 7, 2013

(65) Prior Publication Data
US 2015/0047877 A1  Feb. 19, 2015

(30) Foreign Application Priority Data

Jul. 29, 2011  (KR) .................. 10-2011-0076293
Jul. 29, 2011  (KR) .................. 10-2011-0076294
Jul. 29, 2011  (KR) .................. 10-2011-0076295

(51) Int. Cl.
*B22F 9/24*  (2006.01)
*B82Y 30/00*  (2011.01)
(Continued)

(52) U.S. Cl.
CPC ............. *B22F 9/24* (2013.01); *B22F 1/0025* (2013.01); *B82Y 30/00* (2013.01); *C30B 7/14* (2013.01); *C30B 29/62* (2013.01)

(58) Field of Classification Search
CPC ........ B22F 9/24; B22F 9/20; B22F 2009/245; B22F 1/0025; C30B 7/14; B82Y 30/00
See application file for complete search history.

(56) References Cited

U.S. PATENT DOCUMENTS

2006/0115536 A1  6/2006  Yacaman et al.
2008/0210052 A1  9/2008  Allemand
(Continued)

FOREIGN PATENT DOCUMENTS

JP  2010-255037 A  11/2010
KR  2007-0057602 A  6/2007
WO  WO-2011-071885 A2  6/2011

OTHER PUBLICATIONS

International Search Report in International Application No. PCT/KR2012/005944, filed Jul. 25, 2012.
(Continued)

*Primary Examiner* — Livius R Cazan
(74) *Attorney, Agent, or Firm* — Saliwanchik, Lloyd & Eisenschenk

(57) ABSTRACT

Disclosed are a wire and a method for manufacturing the same. The method includes heating a solvent, adding a capping agent to the solvent, and forming a metallic wire by adding a metallic compound to the solvent. The solvent includes a first solvent having a first reduction power and a second solvent having a second reduction power greater than the first reduction power. The capping agent includes a first capping agent containing a polymer having a first molecular
(Continued)

weight, and a second capping agent containing a polymer having a second molecular weight greater than the first molecular weight.

19 Claims, 1 Drawing Sheet

(51) Int. Cl.
    *C30B 29/62*     (2006.01)
    *C30B 7/14*     (2006.01)
    *B22F 1/00*     (2006.01)

(56) References Cited

U.S. PATENT DOCUMENTS

| | | | |
|---|---|---|---|
| 2009/0196788 A1* | 8/2009 | Wang | B22F 9/24 |
| | | | 420/501 |
| 2011/0048170 A1 | 3/2011 | Bhatia et al. | |
| 2011/0174190 A1 | 7/2011 | Sepa et al. | |

OTHER PUBLICATIONS

Notice of Allowance dated Sep. 30, 2013 in Korean Application No. 10-2011-0076293, filed Dec. 27, 2012.
Yuang Sun et al., Uniform Silver Nanowires Synthesis by Reducing AgN03 with Ethylene Glycol in the Presence of Seeds and Poly-(vinyl pyrrolidone), Chem. Mater, 2002, pp. 4736-4745, vol. 14, University of Washington, Seattle.

\* cited by examiner

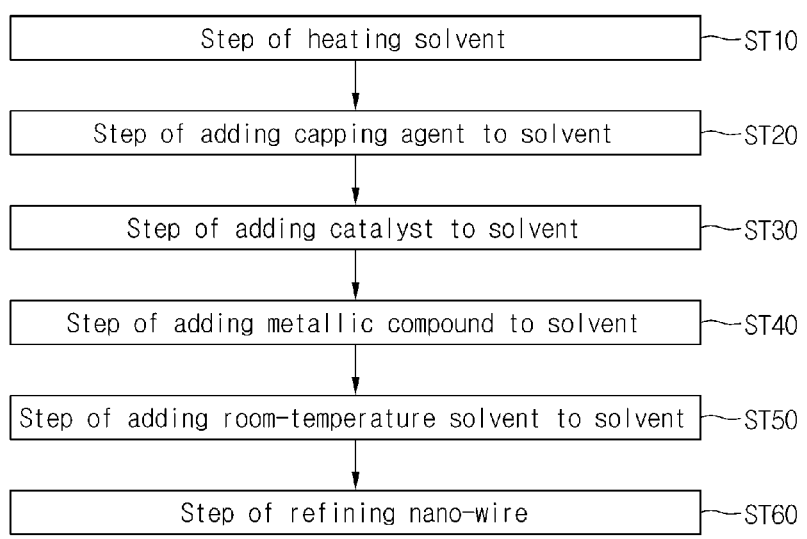

NANO-WIRE AND METHOD FOR MANUFACTURING THE SAME

CROSS-REFERENCE TO RELATED APPLICATIONS

This application is the U.S. national stage application of International Patent Application No. PCT/KR2012/005944, filed Jul. 25, 2012, which claims priority to Korean Application Nos. 10-2011-0076293, 10-2011-0076294, and 10-2011-0076295 filed Jul. 29, 2011, the disclosures of each of which are incorporated herein by reference in their entirety.

TECHNICAL FIELD

The embodiment relates to a nano-wire and a method for manufacturing the same.

BACKGROUND ART

A transparent electrode including transparent material has been applied to electronic products such as a display device, a solar cell, and a mobile device. Researches and studies on a nano-wire, which has a wire-shape structure in a nano-meter size, as the transparent conductive material for the transparent electrode, have been actively carried out.

Since the nano-wire has superior electrical conductivity, flexibility, and transmittance, the transparent electrode can represent superior characteristics. However, nano-wires are easily aggregated during the reaction process, so that nano-particles are formed. Accordingly, the product yield of the nano-wires may be degraded. In addition, when the nano-wires are manufactured, if the length of the nano-wires becomes increased, the diameter of the nano-wires becomes increased. In contrast, if the diameter of the nano-wires becomes reduced, the length of the nano-wires becomes reduced. Accordingly, the manufacturing of a long thin wire is difficult. Therefore, the practical use of the nano-wires is difficult. Further, materials such as catalysts used to accelerate the reaction of forming the nano-wires remain on the surface of the nano-wires, so that the surface oxidation or the surface corrosion of the nano-wires may occur, or the electrical conductivity may be degraded.

DISCLOSURE OF INVENTION

Technical Problem

The embodiment provides a nano-wire having a smaller diameter and a longer length while representing an improved aspect ratio and a method for manufacturing the nano-wire.

Solution to Problem

According to a first embodiment, there is provided a method for manufacturing a wire. The method includes heating a solvent, and forming a metallic wire by adding a metallic compound to the solvent. The solvent includes a first solvent having a first reduction power and a second solvent having a second reduction power greater than the first reduction power.

According to a second embodiment, there is provided a method for manufacturing a wire. The method includes heating a solvent, adding a capping agent to the solvent, and forming a metallic wire by adding a metallic compound to the solvent. The capping agent includes a first capping agent containing a polymer having a first molecular weight, and a second capping agent containing a polymer having a second molecular weight greater than the first molecular weight.

According to a third embodiment, there is provided a method for manufacturing a wire. The method includes heating a solvent, adding a capping agent to the solvent, and forming a metallic wire by adding a metallic compound to the solvent. The solvent includes a first solvent having a first reduction power and a second solvent having a second reduction power greater than the first reduction power. The capping agent includes a first capping agent containing a polymer having a first molecular weight, and a second capping agent containing a polymer having a second molecular weight greater than the first molecular weight.

Advantageous Effects of Invention

As described above, according to the method for manufacturing a wire of the embodiment, metallic compound is reduced by using solvents representing different reduction powers to form a metallic wire.

In particular, the second solvent having higher reduction power can form the long metallic wire, and the first solvent having lower reduction power can form the thin metallic wire.

In other words, the long thin metallic wire can be formed by the first and second solvents. Therefore, according to the method for manufacturing the wire of the embodiment, the metallic wire having a great aspect ratio can be provided.

In addition, according to the method for manufacturing the wire of the embodiment, the first capping agent containing polymer having the first molecular weight and the second capping agent containing polymer having the second molecular weight are used.

In this case, the length of the metallic wire is increased by the second capping agent having the greater molecular weight, and the diameter of the metallic wire can be reduced by the first capping agent having a less molecular weight.

In other words, the long thin metallic wire may be formed by the first and second capping agents. Therefore, according to the method for manufacturing the wire of the embodiment, the metallic wire can be provided with a great aspect ratio.

BRIEF DESCRIPTION OF DRAWINGS

FIG. 1 is a block diagram showing a method for manufacturing a silver wire according to the embodiment.

MODE FOR INVENTION

Hereinafter, a method for manufacturing a wire according to a first embodiment will be described in detail with reference to accompanying drawings.

Referring to FIG. 1, a method for manufacturing a wire according to a first embodiment may include a step of heating a solvent (step ST10), a step of adding a capping agent to the solvent (step ST20), a step of adding a catalyst to the solvent (step ST30), a step of adding metallic compound to the solvent (step ST40), a step of adding a room-temperature solvent to the solvent (step ST50), and a step of refining the wire (step ST60).

According to the step ST10 of heating the solvent, the solvent is heated at the reaction temperature suitable for forming the metallic wire.

The solvent may include polyol. The polyol serves as a mile reducing agent while serving as a solvent of mixing different materials. Therefore, the solvent reduces the metallic compound to form a metallic wire.

The solvent may include the mixture of at least two kinds of materials. For example, the solvent may include first and second solvents. In more detail, the solvent may include the mixture of the first and second solvents.

The first solvent has first reduction power representing weaker reduction power. In more detail, the first solvent has reduction power weaker than that of the second solvent. For example, the first solvent may include ethylene glycol.

The second solvent has second reduction power representing stronger reduction power. In more detail, the second solvent has reduction power stronger than that of the first solvent. In other words, the second reduction power is greater than the first reduction power. The second reduction power represents relatively strong reduction power as compared with the first reduction power, and both of the first and second reduction power may be actually weak.

For example, the second solvent may include propylene glycol. In addition, the first and second solvents may include diethylene glycol, dipropylene glycol, 1,3-propanediol, glycerine, glycerol or glucose.

The ratio of the first solvent to the second solvent may be varied according to the reaction temperature and the type and characteristic of the metallic compound. The volumetric ratio of the first solvent to the second solvent may be in the range of about 1:2 to about 1:4. For example, in order to form the silver wire, when the mixture of ethylene glycol and propylene glycol is used as a solvent, the volumetric ratio of ethylene glycol to propylene glycol may be in the range of about 1:2 to about 1:4. In more detail, in the whole mixed solvent, ethylene glycol may have a volumetric percentage of about 20 vol % to about 30 vol %, and propylene glycol may have a volumetric percentage of about 70 vol % to about 80 vol %.

The reaction temperature may be variously adjusted according to the type and the characteristic of the solvent and the metallic compound. In particular, the reaction temperature may be varied according to the used solvents. For example, if a solvent includes the mixture of ethylene glycol and propylene glycol, the reaction temperature may be in the range of about 110° C. to about 160° C.

Thereafter, in the step of adding the capping agent to the solvent (step ST20), the capping agent inducing the forming of the wire is added to the solvent. If reduction for the forming of the wire is rapidly performed, metals are aggregated, so that the forming of the wire may be difficult. Accordingly, the capping agent prevents the metals from being aggregated by properly dispersing materials contained in the solvent.

The capping agent may include various materials. For example, the capping agent may include material selected from the group consisting of polyvinylpyrrolidone (PVP), polyvinyl alcohol (PVA), cetyl trimethyl ammonium bromide (CTAB), cetyl trimethyl ammonium chloride (CTAC), and polyacrylamide.

Thereafter, in the step of adding the catalyst to the solvent (step ST30), a catalyst including bay salt, refined salt, or a halogen metal such as AgCl, $PtCl_2$, $PdCl_2$, or $AuCl_3$ is added to the solvent. The catalyst includes various meals or a halogen element so that a seed used to form a metallic wire may be formed or the reaction to form the metallic wire may be accelerated.

Thereafter, in the step of adding the metallic compound to the solvent (step ST40), a reaction solution is formed by adding the metallic compound to the solvent.

In this case, the metallic compound melted in a separate solvent may be added to the solvent having the capping agent and the catalyst. The separate solvent may include material identical to or different from material used in the initial stage. The metallic compound may be added after a predetermined time elapses from a time in which the catalyst is added. This is required to stabilize a temperature to a desirable reaction temperature.

In this case, the metallic compound includes a compound including metal used to manufacture a desirable metallic wire. In order to form a silver wire, the metallic compound may include AgCl, AgNO3 or $KAg(CN)_2$.

As described above, if the metallic compound is added to the solvent having the capping agent and the catalyst, reaction occurs so that the forming of the metallic wire is started.

According to the present embodiment, the capping agent may be added by the content of 60 weight part to 330 weight part with respect to 100 weight part of the metallic compound such as AgCl, $AgNO_3$ or $KAg(CN)_2$. If the capping agent is added by the content of less than 60 weight part, the aggregation cannot be prevented sufficiently. If the capping agent is added by the content of more than 330 weight part, metallic nano-particles may be formed in a spherical shape or a cube shape, and the capping agent remains in the metallic wire so that the electrical conductivity may be degraded.

In addition, the catalyst may be added by the content of 0.005 weight part to 0.5 weight part with respect to 100 weight part of the metallic compound. If the catalyst is added by the content of less than 0.005 weight part, reaction may not be sufficiently accelerated. In addition, if the catalyst is added by the content of more than 0.5 weight part, the reduction of silver is rapidly performed, so that silver nano-particles may be created, or the diameter of the wire may be increased and the length of the wire may be shorted. In addition, the catalyst remains in the manufactured metallic wire so that the electrical conductivity may be degraded.

Thereafter, in the step of adding the room-temperature solvent to the solvent (step ST50), the room-temperature solvent is added to the solvent in which reaction is started. The room-temperature solvent may include material identical to or different from material used in the initial stage. For example, the room-temperature solvent may include polyol such as ethylene glycol and propylene glycol.

As the solvent, in which the reaction is started, is continuously heated in order to maintain the constant reaction temperature, the temperature may be increased in the process of the reaction. As described above, the reaction temperature may be more constantly maintained by temporarily degrading the temperature of the solvent by adding the room-temperature solvent to the solvent in which the reaction is started.

The step of adding the room-temperature solvent (step ST50) may be performed one time or several times by taking the reaction time, and the temperature of the reaction solution into consideration.

Thereafter, in the step of refining the wire (step ST60), the metallic wire is refined and collected in the reaction solution.

In more detail, if acetone serving as a non-polar solvent is added to the reaction solution rather than water, the metallic wire is deposited at the lower portion of the solution due to the capping agent remaining on the surface of the metallic wire. This is because the capping agent is not dissolved in the acetone, but aggregated and deposited although the capping agent is sufficiently dissolved in the solvent. Thereafter, when the upper portion of the solution is discarded, a portion of the capping agent and nano-particles are discarded.

If distill water is added to the remaining solution, metallic wire and metallic nano-particles are dispersed. In addition, if acetone is more added, the metallic wire is deposited, and the metallic nano-particles are dispersed in the upper portion of the solution. Thereafter, if the upper portion of the solution is discarded, a part of the capping agent and the aggregated metallic nano-particles are discarded. After collecting the metallic wire by repeatedly performing the above processes, the metallic wire is stored in the distill water. The metallic wire can be prevented from being re-aggregated by storing the metallic wire into the distill water.

As described above, according to the method for manufacturing the wire of the embodiment, the metallic compound is reduced by using the first and second solvents having reduction powers different from each other so that the metallic wire can be formed.

In particular, the second solvent representing stronger reduction power may form the long metallic wire, and the first solvent representing weaker reduction power may form the thin metallic wire. In other works, a long thin metallic wire may be formed by the first and second solvents. Therefore, according to the method for manufacturing the wire of the embodiment, a metallic wire having a great aspect ratio can be provided.

For example, the metallic wire according to the embodiment may have a diameter of about 55 nm or less and a length of about 30 μm or more. In more detail, the metallic wire according to the embodiment may have a diameter in the range of about 30 nm to about 55 nm, and the length in the range of about 20 μm to about 60 μm. In more detail, the metallic wire according to the embodiment may have the diameter in the range of about 48 nm to about 52 nm and may have the length of about 30 μm to about 40 μm.

Therefore, the metallic wire manufactured according to the embodiment may have an aspect ratio of about 360 or more. In more detail, the metallic wire manufactured according to the embodiment may have the aspect ratio of about 364 to about 2000.

Therefore, when the metallic wire manufactured according to the present embodiment is used for an electrode, the metallic wire can represent higher optical and electrical characteristics. In other words, the metallic wire according to the present embodiment can constitute the electrode while forming a network structure. In this case, since the metallic wire according to the present embodiment is thin and long, the transmittance and the transparency can be increased, and the resistance can be reduced.

Hereinafter, the embodiment of the disclosure will be described in more detail. However, the embodiment is provided only for the illustrative purpose of the disclosure, and the disclosure is not limited thereto.

Embodiment 1

About 2000 ml of a solvent in which ethylene glycol and propylene glycol are mixed with each other at the ratio of about 1:2 was prepared. The solvent was heated at the temperature of about 130° C. Then, after adding and melting 67 g of polyvinylpyrrolidone into the solvent, 0.75 g of KBr and 2.25 g of AgCl were added. Thereafter, about 22 g of AgNO$_3$ was melted in 1000 ml of mixed solution of ethylene glycol and propylene glycol (mixed with each other at the ratio of about 1:2) and added into the mixed solution of polyvinylpyrrolidone (PVP), KBr, and the solvent. Thereafter, the silver wire had been formed by continuously performing the reaction for about one hour.

After adding 500 ml of acetone to the solution which was had been subject to the reaction, the upper portion of the solution having ethylene glycol, propylene glycol, and silver nano-particles dispersed therein was discarded.

The aggregated silver wires and the silver nano-particles had been dispersed by adding 100 ml of distilled water. In addition, after additionally putting 500 ml of acetone, the upper portion of the solution having ethylene glycol, propylene glycol, and silver nano-particles dispersed therein had been discarded. After repeatedly performing the above processes three times, the result was stored in 10 ml of distill water.

Comparative Example 1

The experiment according to the first comparative example was performed under the same condition as that of the first embodiment except that only ethylene glycol had been used as the solvent (including additionally-put solvent) rather than propylene glycol.

Second Comparative Example

The experiment according to the second comparative example was performed under the same condition as that of the first comparative example except that only propylene glycol had been used as the solvent (including additionally-put solvent) rather than ethylene glycol.

Result

As shown in following table 1, the metallic wires in the first comparative example had a length shorter than that of the metallic wires according to the first embodiment, and the metallic wires in the second comparative example had a thickness thicker than that of the metallic wires according to the first embodiment. In other words, according to the first embodiment, long thin silver wires had been manufactured.

TABLE 1

|  | Length | Diameter |
| --- | --- | --- |
| Embodiment 1 | 30 μm | 50 nm |
| Comparative Example 1 | 15 μm | 50 nm |
| Comparative Example 2 | 30 μm | 70 nm |

Hereinafter, a method for manufacturing wires according to a second embodiment will be described in detail with reference to accompanying drawings. The description of the second embodiment will be made by making reference to the above description of the method for manufacturing the wires according to the first embodiment. The above description of the first embodiment will be incorporated in the description of the second embodiment except for the modification.

Referring to FIG. 1, the method for manufacturing a wire according to the embodiment may include the step of heating a solvent (step ST10), the step of adding a capping agent to the solvent (step ST20), the step of adding a catalyst to the solvent (step ST30), the step of adding metallic compound in the solvent (step ST40), the step of adding a room-temperature solvent to the solvent (step ST50), and the step of refining the wire (step ST60).

According to the step ST10 of heating the solvent, the solvent is heated at the reaction temperature suitable for forming the metallic wire. The reaction temperature may be in the range of about 110° C. to about 170° C. In more detail, the reaction temperature may be in the range of about 110° C. to about 140° C.

The solvent may include polyol. The polyol serves as a mile reducing agent while serving as a solvent of mixing different materials to assist the forming of the metallic wires. For example, the polyol may include ethylene glycol (EG), propylene glycol (PG), diethylene glycol, dipropylene glycol, 1,3-propanediol, glycerine, glycerol or glucose. The reaction temperature may be variously adjusted by taking the types and the characteristics of solvents and the metallic compounds into consideration.

Thereafter, in the step of adding the capping agent to the solvent (step ST20), the capping agent inducing the forming of the wire is added to the solvent. If reduction for the forming of the wire is rapidly performed, metals are aggregated, so that the forming of the wire may be difficult. Accordingly, the capping agent prevents materials contained in the solvent from being aggregated by properly dispersing materials contained in the solvent, so that the growing of the wires can be induced.

The capping agent may include first and second capping agents.

The first capping agent includes polymer having the first molecular weight. In addition, the second capping agent includes polymer having the second molecular weight greater than the first molecular weight. In other words, the molecular weight of the first capping agent is less than the molecular weight of the second capping agent.

The first and second capping agents may include the same polymer. In addition, the polymer of the first capping agent may be different from the polymer of the second capping agent.

The polymer constituting the first and second capping agents may include material selected from the group consisting of polyvinylpyrrolidone (PVP), polyvinyl alcohol (PVA), and polyacrylamide (PAA).

The polymer having the first molecular weight may have the average molecular weight of about 40000 to 80000. The polymer having the second molecular weight may have the average molecular weight of about 240000 to 450000.

In particular, the polymer having the first molecular weight and the polymer having the second molecular weight may be polyvinylpyrrolidone. In more detail, the first capping agent may include polyvinylpyrrolidone having the average molecular weight of about 40000 to about 80000, and the second capping agent may include polyvinylpyrrolidone having the average molecular weight of about 240000 to about 450000.

The weight ratio of the first capping agent to the second capping agent may be in the range of about 2:1 to about 8:1. In more particular, in the capping agent, the first capping agent may have the content of about 70 wt % to about 90 wt %, and the second capping agent may have the content of about 10 wt % to about 30 wt %.

In particular, the capping agent may include the polyvinylpyrrolidone having the average molecular weight of about 40000 to about 80000 and the polyvinylpyrrolidone having the average molecular weight of about 240000 to about 450000 at the ratio of about 2:1 to about 8:1. In more detail, in the capping agent, the polyvinylpyrrolidone having the average molecular weight of about 40000 to about 80000 may have the content of about 70 wt % to about 90 wt %, and the polyvinylpyrrolidone having the average molecular weight of about 240000 to about 450000 may have the content of about 10 wt % to about 30 wt %.

The first capping agent includes polymer having the first molecular weight representing a less molecular weight, so that thin metallic wires having a smaller diameter may be manufactured by the first capping agent. In addition, the second capping agent includes polymer having the second molecular weight representing a greater molecular weight, so that metallic wires having a long length can be manufactured by the second capping agent. In other words, the long thin metallic wires may be manufactured by the first and second capping agents.

For example, the polymer having the first molecular weight and the polymer having the second molecular weight may have the spiral structure. In this case, the polymer having the second molecular weight can extend with a longer length in the spiral structure having a greater diameter. In addition, the polymer having the first molecular weight may extend with a shorter length in the spiral structure having a smaller diameter. In this case, several molecules of the polymer having the first molecular weight may be provided in one molecule of the polymer having the second molecular weight to form a complex. The complex may have a smaller inner diameter and a long length. Long thin metallic wires may be manufactured in the complex.

As described above, according to the method for manufacturing wires of the embodiment, the first capping agent including the polymer having the first molecular weight and the second capping agent including the polymer having the second molecular weight are used.

In this case, the length of the metallic wire is increased by the second capping agent having the greater molecular weight, and the diameter of the metallic wire can be reduced by the first capping agent having a less molecular weight.

In other words, the long thin metallic wire may be formed by the first and second capping agents. Therefore, according to the method for manufacturing the wire of the embodiment, the metallic wire can be provided with a great aspect ratio.

For example, the metallic wire according to the embodiment may have a diameter of about 60 nm or less and a length of about 20 μm or more. In more detail, the metallic wire according to the embodiment may have a diameter in the range of about 30 nm to about 60 nm, and the length in the range of about 20 μm to about 60 μm. In more detail, the metallic wire according to the embodiment may have a diameter in the range of about 54 nm to about 56 nm, and the length in the range of about 30 μm to about 40 μm.

Therefore, the metallic wire manufactured according to the embodiment may have an aspect ratio of about 333 or more. In more detail, the metallic wire manufactured according to the embodiment may have the aspect ratio of about 333 to about 2000.

Therefore, when the metallic wire manufactured according to the present embodiment is used for an electrode, the metallic wire can represent higher optical and electrical characteristics. In other words, the metallic wire according to the present embodiment can constitute the electrode while forming a network structure. In this case, since the metallic wire according to the present embodiment is thin and long, the transmittance and the transparency can be increased, and the resistance can be reduced.

Hereinafter, the embodiment of the disclosure will be described in more detail. However, the embodiment is provided only for the illustrative purpose of the disclosure, and the disclosure is not limited thereto.

Embodiment 2

About 2000 ml of an ethylene glycol solvent was prepared by mixing ethylene glycol and propylene glycol with each other at the ratio of about 1:2. The solvent was heated at the temperature of about 130° C. Then, after adding and melting 57 g of polyvinylpyrrolidone (having the molecular weight of 40000 to 80000) and 10 g of polyvinylpyrrolidone (having the molecular weight of 240000 to 450000) into the solvent, 0.75 g of KBr and 2.55 g of AgCl were added. After about one hour and a half elapsed, about 17 g of AgNO$_3$ was melted in 1000 ml of ethylene glycol and added to the mixed solution of polyvinylpyrrolidone (PVP), KBr, and the solvent. Thereafter, the silver wire had been formed by continuously performing the reaction for about one hour and a half.

After adding 1200 ml of acetone to the solution which had been subject to the reaction, the upper portion of the solution having ethylene glycol, propylene glycol, and silver nano-particles dispersed therein was discarded.

The aggregated silver wires and the aggregated silver nano-particles had been dispersed by adding 1000 ml of distilled water. In addition, after additionally putting 4000 ml of acetone, the upper portion of the solution having ethylene glycol, propylene glycol, and silver nano-particles dispersed therein had been discarded. After repeatedly performing the above processes three times, the result was stored in 1000 ml of distill water.

Comparative Example 3

The experiment according the third comparative example was performed under the same condition as that of the second embodiment except that 67.0 g of polyvinylpyrrolidone (having the molecular weight of 44000 to 58000) was used as the capping agent, and polyvinylpyrrolidone having the molecular weight of 280000 to 360000 are not used.

Result

As shown in following table 2, according to the second embodiment, silver wires are manufactured with a diameter approximating to that of the third comparative example while representing a length longer than that of the third comparative example.

TABLE 2

|  | Length | Diameter |
| --- | --- | --- |
| Embodiment 2 | 45 μm | 55 nm |
| Comparative Example 3 | 20 μm | 50 nm |

Hereinafter, a method for manufacturing wires according to a third embodiment will be described in detail with reference to accompanying drawings. The description of the third embodiment will be made by making reference to the above description of the method for manufacturing the wires according to the first and second embodiments. The above description of the first and second embodiments will be incorporated in the description of the third embodiment except for the modification.

Referring to FIG. 1, the method for manufacturing a wire according to the embodiment may include the step of heating a solvent (step ST10), the step of adding a capping agent to the solvent (step ST20), the step of adding a catalyst to the solvent (step ST30), the step of adding metallic compound in the solvent (step ST40), the step of adding a room-temperature solvent to the solvent (step ST50), and the step of refining the wire (step ST60).

According to the step ST10 of heating the solvent, the solvent is heated at the reaction temperature suitable for forming the metallic wire.

The solvent may include polyol. The polyol serves as a mile reducing agent while serving as a solvent of mixing different materials. Therefore, the solvent reduces the metallic compound to form a metallic wire.

The solvent may include the mixture of at least two kinds of materials. For example, the solvent may include first and second solvents. In more detail, the solvent may include the mixture of the first and second solvents.

The first solvent has first reduction power representing weaker reduction power. In more detail, the first solvent has reduction power weaker than that of the second solvent. For example, the first solvent may include ethylene glycol.

The second solvent has second reduction power representing stronger reduction power. In more detail, the second solvent has reduction power stronger than that of the first solvent. In other words, the second reduction power is greater than the first reduction power. The second reduction power represents relatively strong reduction power as compared with the first reduction power, and both of the first and second reduction power may be actually weak.

For example, the second solvent may include propylene glycol. In addition, the first and second solvents may include diethylene glycol, dipropylene glycol, 1,3-propanediol, glycerine, glycerol or glucose.

The ratio of the first solvent to the second solvent may be varied according to the reaction temperature and the type and characteristic of the metallic compound. The volumetric ratio of the first solvent to the second solvent may be in the range of about 1:1 to about 1:4. For example, in order to form the silver wire, when the mixture of ethylene glycol and propylene glycol is used as a solvent, the volumetric ratio of ethylene glycol to propylene glycol may be in the range of about 1:1 to about 1:4. In more detail, in the whole mixed solvent, ethylene glycol may have a volumetric percentage of about 20 vol % to about 50 vol %, and propylene glycol may have a volumetric percentage of about 50 vol % to about 80 vol %.

The reaction temperature may be variously adjusted according to the type and the characteristic of the solvent and the metallic compound. In particular, the reaction temperature may be varied according to the used solvents. For example, if a solvent includes the mixture of ethylene glycol and propylene glycol, the reaction temperature may be in the range of about 110° C. to about 160° C.

Thereafter, in the step of adding the capping agent to the solvent (step ST20), the capping agent inducing the forming of the wire is added to the solvent. If reduction for the forming of the wire is rapidly performed, metals are aggregated, so that the forming of the wire may be difficult. Accordingly, the capping agent prevents the metals from being aggregated by properly dispersing materials contained in the solvent.

The capping agent may include the first and second capping agents.

The first capping agent includes polymer having the first molecular weight. In addition, the second capping agent includes polymer having the second molecular weight greater than the first molecular weight. In other words, the molecular weight of the first capping agent is less than the molecular weight of the second capping agent.

The first and second capping agents may include the same polymer. In addition, the polymer of the first capping agent may be different from the polymer of the second capping agent.

The polymer constituting the first and second capping agents may include material selected from the group consisting of polyvinylpyrrolidone (PVP), polyvinyl alcohol (PVA), and polyacrylamide (PAA).

The polymer having the first molecular weight may have the average molecular weight of about 40000 to 80000. The polymer having the second molecular weight may have the average molecular weight of about 240000 to 450000.

In particular, the polymer having the first molecular weight and the polymer having the second molecular weight may be polyvinylpyrrolidone. In more detail, the first capping agent may include polyvinylpyrrolidone having the average molecular weight of about 40000 to about 80000, and the second capping agent may include polyvinylpyrrolidone having the average molecular weight of about 240000 to about 450000.

The weight ratio of the first capping agent to the second capping agent may be in the range of about 2:1 to about 8:1. In more particular, in the capping agent, the first capping agent may have the content of about 70 wt % to about 90 wt %, and the second capping agent may have the content of about 10 wt % to about 30 wt %.

In particular, the capping agent may include the polyvinylpyrrolidone having the average molecular weight of about 40000 to about 80000 and the polyvinylpyrrolidone having the average molecular weight of about 240000 to about 450000 at the ratio of about 2:1 to about 8:1. In more detail, in the capping agent, the polyvinylpyrrolidone having the average molecular weight of about 40000 to about 80000 may have the content of about 70 wt % to about 90 wt %, and the polyvinylpyrrolidone having the average molecular weight of about 240000 to about 450000 may have the content of about 10 wt % to about 30 wt %.

The first capping agent includes polymer having the first molecular weight representing a less molecular weight, so that thin metallic wires having a smaller diameter may be manufactured by the first capping agent. In addition, the second capping agent includes polymer having the second molecular weight representing a greater molecular weight, so that metallic wires having a long length can be manufactured by the second capping agent. In other words, the long thin metallic wires may be manufactured by the first and second capping agents.

For example, the polymer having the first molecular weight and the polymer having the second molecular weight may have the spiral structure. In this case, the polymer having the second molecular weight can extend with a longer length in the spiral structure having a greater diameter. In addition, the polymer having the first molecular weight may extend with a shorter length in the spiral structure having a smaller diameter. In this case, several molecules of the polymer having the first molecular weight may be provided in one molecule of the polymer having the second molecular weight to form a complex. The complex may have a smaller inner diameter and a long length. Long thin metallic wires may be manufactured in the complex.

As described above, according to the method for manufacturing wires of the embodiment, the metallic compound is reduced, and the metallic wires are formed by using the first and second solvents having different reduction powers.

In particular, the second solvent having a higher reduction potential can form the long metallic wire, and the first solvent having a lower reduction potential can form the thin metallic wire. In other words, the long thin metallic wire can be formed by the first and second solvents. Therefore, according to the method for manufacturing the wire of the embodiment, the metallic wire having a great aspect ratio can be provided.

In addition, according to the method for manufacturing the wire of the embodiment, the first capping agent including polymer having the first molecular weight and the second capping agent including polymer having the second molecular weight are used.

In this case, the length of the metallic wire is increased by the second capping agent having the greater molecular weight, and the diameter of the metallic wire can be reduced by the first capping agent having a less molecular weight.

In other words, the long thin metallic wire may be formed by the first and second capping agents. Therefore, according to the method for manufacturing the wire of the embodiment, the metallic wire can be provided with a great aspect ratio.

For example, the metallic wire according to the embodiment may have a diameter of about 55 nm or less and a length of about 30 μm or more. In more detail, the metallic wire according to the embodiment may have a diameter in the range of about 30 nm to about 55 nm, and the length in the range of about 20 μm to about 60 μm.

Therefore, the metallic wire manufactured according to the embodiment may have an aspect ratio of about 364 or more. In more detail, the metallic wire manufactured according to the embodiment may have the aspect ratio of about 364 to about 2000.

Therefore, when the metallic wire manufactured according to the present embodiment is used for an electrode, the metallic wire can represent higher optical and electrical characteristics.

In other words, the metallic wire according to the present embodiment can constitute the electrode while forming a network structure. In this case, since the metallic wire according to the present embodiment is thin and long, the transmittance and the transparency can be increased, and the resistance can be reduced.

Hereinafter, the embodiment of the disclosure will be described in more detail. However, the embodiment is provided only for the illustrative purpose of the disclosure, and the disclosure is not limited thereto.

Embodiment 3

About 2000 ml of a solvent in which ethylene glycol and propylene glycol were mixed with each other at the ratio of about 1:2 was prepared. The solvent was heated at the temperature of about 130° C. Then, after adding and melting 57 g of polyvinylpyrrolidone (having the molecular weight of 40000 to 80000) and 10 g of polyvinylpyrrolidone (having the molecular weight of 240000 to 450000) into the solvent, 0.75 g of KBr and 2.55 g of AgCl were added. After about one hour and a half elapsed, about 222 g of $AgNO_3$ was melted in 100 ml of the mixed solution of ethylene glycol and polyvinylpyrrolidone (mixed with each other at the ratio of 1:2) and added to the mixed solution of polyvinylpyrrolidone (PVP), KBr, and the solvent. Thereafter, the silver wire had been formed by continuously performing the reaction for about one hour and a half.

After adding 1200 ml of acetone to the solution which had been subject to the reaction, the upper portion of the solution having ethylene glycol, propylene glycol, and silver nano-particles dispersed therein was discarded.

The aggregated silver wires and the aggregated silver nano-particles had been dispersed by adding 1000 ml of distilled water. In addition, after additionally putting 4000 ml of acetone, the upper portion of the solution having ethylene glycol, propylene glycol, and silver nano-particles dispersed therein had been discarded. After repeatedly performing the above processes three times, the result was stored in 1000 ml of distill water.

Comparative Example 4

The experiment according to the fourth comparative example was performed under the same condition as that of the third embodiment except that only ethylene glycol is used without propylene glycol, and 67.0 g of polyvinylpyrrolidone (having the molecular weight of 44000 to 58000) is used without polyvinylpyrrolidone having the molecular weight of 280000 to 360000.

Embodiment 5

The experiment according to the fifth comparative example was performed under the same condition as that of the fourth embodiment except that 2000 ml of a propylene glycol solution is used without ethylene glycol.

Result

As shown in following table 3, the metallic wires in the fourth comparative example had a length shorter than that of the metallic wires according to the third embodiment, and the metallic wires in the fifth comparative example had a thickness thicker than that of the metallic wires according to the third embodiment. In other words, according to the third embodiment, long thin silver wires had been manufactured.

TABLE 3

|  | Length | Diameter |
| --- | --- | --- |
| Embodiment 3 | 35 μm | 50 nm |
| Comparative Example 4 | 15 μm | 50 nm |
| Comparative Example 5 | 30 μm | 80 nm |

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method for manufacturing a wire, the method comprising:
heating a solvent;
adding a catalyst to the solvent; and
forming a metallic wire by adding a metallic compound to the solvent,
wherein the solvent includes a first solvent having a first reduction power and a second solvent having a second reduction power greater than the first reduction power,
wherein a volumetric ratio of the first solvent to the second solvent is in a range of 1:2 to 1:4,
wherein, in the step of the adding the catalyst to the solvent, AgCl and KBr are added to the solvent, and
wherein the amount of AgCl added to the solvent is larger than the amount of KBr added to the solvent.

2. The method of claim 1, wherein the first and second solvents include glycol.

3. The method of claim 2, wherein the first solvent includes ethylene glycol, and the second solvent includes propylene glycol.

4. The method of claim 1, wherein the metallic compound includes a silver compound.

5. The method of claim 4, wherein the silver compound includes $AgCl$, $AgNO_3$ or $KAg(CN)_2$.

6. The method of claim 1, wherein the solvent is heated at a temperature of 110° C. to 160° C.

7. The method of claim 1, further comprising adding a capping agent to the solvent.

8. The method of claim 7, wherein the capping agent includes material selected from the group consisting of polyvinylpyrrolidone (PVP), polyvinyl alcohol (PVA), cetyltrimethyl ammonium bromide (CTAB), cetyl trimethyl ammonium chloride (CTAC), and polyacrylamide.

9. The method of claim 7, wherein the metallic compound melted in a separate solvent, is added to the solvent having the capping agent.

10. The method of claim 9, wherein the capping agent is added by the content of 60 weight parts to 330 weight parts with respect to 100 weight parts of the metallic compound.

11. The method of claim 9, wherein the separate solvent includes material identical to the solvent having the capping agent.

12. The method of claim 1, wherein the metallic compound, melted in a separate solvent, is added to the solvent having the catalyst.

13. The method of claim 12, wherein the catalyst is added by the content of 0.005 weight part to 0.5 weight part with respect to 100 weight parts of the metallic compound.

14. The method of claim 1, wherein the forming the metallic wire is to form the metallic wire having a diameter of 30 nm to 55 nm.

15. The method of claim 1, wherein the forming the metallic wire is to form the metallic wire having a length of 20 μm to 60 μm.

16. The method of claim 1, wherein the forming the metallic wire is to form the metallic wire having an aspect ratio of 364 to 2,000.

17. The method of claim 1, wherein the forming the metallic wire is to form the metallic wire having a network structure.

18. The method of claim 1, further comprising adding a room-temperature solvent to the solvent in which the reaction is started.

19. The method of claim 18, wherein the room-temperature solvent includes material identical to that of the solvent.

* * * * *